United States Patent
Sutioso et al.

(10) Patent No.: US 7,263,153 B2
(45) Date of Patent: Aug. 28, 2007

(54) CLOCK OFFSET COMPENSATOR

(75) Inventors: Henri Sutioso, San Jose, CA (US); Lei Wu, Sunnyvale, CA (US)

(73) Assignee: Marvell International, Ltd., Hamilton (BM)

( * ) Notice: Subject to any disclaimer, the term of this patent is extended or adjusted under 35 U.S.C. 154(b) by 792 days.

(21) Appl. No.: 10/267,177

(22) Filed: Oct. 9, 2002

(65) Prior Publication Data

US 2004/0071251 A1   Apr. 15, 2004

(51) Int. Cl.
H03D 3/24   (2006.01)
(52) U.S. Cl. .................. 375/373; 375/144; 375/232; 375/377; 375/376; 375/371; 370/350; 360/55; 324/76.82
(58) Field of Classification Search .......... 375/373, 375/144, 232, 377, 376, 326, 371; 370/350; 360/55; 324/76.82
See application file for complete search history.

(56) References Cited

U.S. PATENT DOCUMENTS

| | | | |
|---|---|---|---|
| 4,456,965 A | 6/1984 | Graber et al. | |
| 4,747,047 A | 5/1988 | Coogan et al. | |
| 5,210,855 A | 5/1993 | Bartol | |
| 5,220,275 A * | 6/1993 | Holmqvist | 324/76.82 |
| 5,222,062 A | 6/1993 | Sharma et al. | |
| 5,274,665 A * | 12/1993 | Schilling | 375/144 |
| 5,331,646 A | 7/1994 | Krueger et al. | |
| 5,446,767 A * | 8/1995 | Nakagawa et al. | 375/376 |
| 5,471,152 A | 11/1995 | Gheewala et al. | |
| 5,471,585 A | 11/1995 | Barakat et al. | |
| 5,553,230 A | 9/1996 | Petersen et al. | |
| 5,564,114 A | 10/1996 | Popat et al. | |
| 5,661,765 A * | 8/1997 | Ishizu | 375/376 |
| 5,748,645 A | 5/1998 | Hunter et al. | |
| 5,783,960 A | 7/1998 | Lackey | |
| 5,787,485 A | 7/1998 | Fitzgerald et al. | |
| 5,802,318 A | 9/1998 | Murray et al. | |
| 5,812,754 A | 9/1998 | Lui et al. | |
| 5,826,048 A | 10/1998 | Dempsey et al. | |
| 5,828,854 A | 10/1998 | Wade | |

(Continued)

FOREIGN PATENT DOCUMENTS

EP   0876016 A1 * 11/1998

(Continued)

OTHER PUBLICATIONS

Spread Spectrum Scene; http://sss-mag.com/ss.html#tutorial; Mar. 27, 2007; pp. 1-6.*

(Continued)

*Primary Examiner*—Chieh M. Fan
*Assistant Examiner*—Sudhanshu C. Pathak

(57) ABSTRACT

A device communicates with a host and includes a transmitter, a receiver and a clock generator that generates a signal having a local clock frequency. A clock recovery circuit communicates with the receiver and recovers a host clock frequency from data received from the host by the receiver. A frequency offset circuit communicates with the clock recovery circuit and the clock generator and generates a frequency offset based on the clock frequency and the recovered host clock frequency. A frequency compensator compensates a frequency of the transmitter using the frequency offset. The host and the device may communicate using a serial ATA standard. Frequency compensation can be performed during spread spectrum operation.

35 Claims, 8 Drawing Sheets

U.S. PATENT DOCUMENTS

| | | | |
|---|---|---|---|
| 5,848,278 | A | 12/1998 | Sakai |
| 5,854,941 | A | 12/1998 | Ballard et al. |
| 5,886,901 | A | 3/1999 | Magoshi |
| 5,894,560 | A | 4/1999 | Carmichael et al. |
| 5,909,451 | A | 6/1999 | Lach et al. |
| 6,009,275 | A | 12/1999 | DeKoning et al. |
| 6,021,462 | A | 2/2000 | Minow et al. |
| 6,057,863 | A | 5/2000 | Olarig |
| 6,059,836 | A | 5/2000 | Liguori |
| 6,073,188 | A | 6/2000 | Fleming |
| 6,092,169 | A | 7/2000 | Murthy et al. |
| 6,106,568 | A | 8/2000 | Beausang et al. |
| 6,178,215 | B1* | 1/2001 | Zhang et al. .............. 375/371 |
| 6,223,238 | B1 | 4/2001 | Meyer et al. |
| 6,237,052 | B1 | 5/2001 | Stolowitz |
| 6,314,145 | B1* | 11/2001 | van Driest .............. 375/326 |
| 6,330,687 | B1 | 12/2001 | Griffith |
| 6,363,439 | B1 | 3/2002 | Battles et al. |
| 6,367,033 | B1 | 4/2002 | Jibbe |
| 6,378,039 | B1 | 4/2002 | Obara et al. |
| 6,442,722 | B1 | 8/2002 | Nadeau-Dostic |
| 6,447,340 | B1 | 9/2002 | Wu |
| 6,484,294 | B1 | 11/2002 | Kiyoshige et al. |
| 6,496,900 | B1 | 12/2002 | McDonald et al. |
| 6,549,981 | B2 | 4/2003 | McDonald et al. |
| 6,557,065 | B1 | 4/2003 | Peleg et al. |
| 6,564,271 | B2 | 5/2003 | Micalizzi, Jr. et al. |
| 6,578,126 | B1 | 6/2003 | MacLellan et al. |
| 6,614,842 | B1* | 9/2003 | Chou et al. .............. 375/232 |
| 6,662,076 | B1 | 12/2003 | Conboy et al. |
| 6,678,768 | B1 | 1/2004 | Craft |
| 6,687,775 | B1 | 2/2004 | Bassett |
| 6,697,867 | B1 | 2/2004 | Chong, Jr. |
| 6,704,300 | B1* | 3/2004 | Chen et al. .............. 370/350 |
| 6,791,779 | B1* | 9/2004 | Singh et al. .............. 360/55 |
| 6,792,494 | B2 | 9/2004 | Bennett et al. |
| 6,813,688 | B2 | 11/2004 | Wu et al. |
| 6,845,420 | B2 | 1/2005 | Resnick |
| 6,854,045 | B2 | 2/2005 | Ooi et al. |
| 6,898,655 | B1 | 5/2005 | Sutardja |
| 6,908,330 | B2 | 6/2005 | Garrett et al. |
| 6,915,380 | B2 | 7/2005 | Tanaka et al. |
| 6,917,992 | B2 | 7/2005 | Grimsrud et al. |
| 6,922,738 | B2 | 7/2005 | Drescher et al. |
| 6,928,509 | B2 | 8/2005 | Surugucchi |
| 6,961,813 | B2 | 11/2005 | Grieff et al. |
| 6,978,337 | B1 | 12/2005 | Chang |
| 7,089,345 | B1 | 8/2006 | Lynn |
| 2002/0159311 | A1 | 10/2002 | Coffey et al. |
| 2002/0186706 | A1 | 12/2002 | Chren et al. |
| 2003/0005231 | A1 | 1/2003 | Ooi et al. |
| 2003/0035504 | A1* | 2/2003 | Wong et al. .............. 375/377 |
| 2003/0074515 | A1 | 4/2003 | Resnick |
| 2003/0135577 | A1 | 7/2003 | Weber et al. |
| 2003/0145264 | A1 | 7/2003 | Siegel et al. |
| 2003/0167367 | A1 | 9/2003 | Kaushik et al. |
| 2003/0236952 | A1 | 12/2003 | Grieff et al. |
| 2004/0015637 | A1 | 1/2004 | Yau |
| 2004/0024950 | A1 | 2/2004 | Surugucchi |
| 2004/0044802 | A1 | 3/2004 | Chiang et al. |
| 2004/0068591 | A1 | 4/2004 | Workman et al. |
| 2004/0081179 | A1 | 4/2004 | Gregorcyk |
| 2004/0083323 | A1 | 4/2004 | Rabinovitz et al. |
| 2004/0083324 | A1 | 4/2004 | Rabinovitz et al. |
| 2004/0088441 | A1 | 5/2004 | Chiang et al. |
| 2004/0100944 | A1 | 5/2004 | Richmond et al. |
| 2004/0113662 | A1 | 6/2004 | Grimsrud |
| 2004/0117522 | A1 | 6/2004 | Loffink et al. |
| 2004/0120353 | A1 | 6/2004 | Kim et al. |
| 2004/0198104 | A1 | 10/2004 | Hadba et al. |
| 2004/0199515 | A1 | 10/2004 | Penny et al. |
| 2004/0203295 | A1 | 10/2004 | Hadba et al. |
| 2004/0205288 | A1 | 10/2004 | Ghaffari et al. |
| 2004/0252716 | A1 | 12/2004 | Nemazie |
| 2004/0264284 | A1 | 12/2004 | Priborsky et al. |
| 2005/0005216 | A1 | 1/2005 | Chameshlu et al. |
| 2005/0015655 | A1 | 1/2005 | Clayton et al. |
| 2005/0024083 | A1 | 2/2005 | Kitzmura et al. |
| 2005/0027894 | A1 | 2/2005 | Ayyavu et al. |
| 2005/0055501 | A1 | 3/2005 | Guha et al. |
| 2005/0144490 | A1 | 6/2005 | Igari |
| 2005/0204078 | A1 | 9/2005 | Steinmetz et al. |
| 2005/0246475 | A1 | 11/2005 | Ervin |
| 2005/0251588 | A1 | 11/2005 | Hoch et al. |

FOREIGN PATENT DOCUMENTS

| | | | |
|---|---|---|---|
| GB | 2 408 624 A | 3/2004 | |

OTHER PUBLICATIONS

"Serial ATA: High Speed Serialized AT Attachment", Serial ATA Organization, Revision 1.0, Aug. 29, 2001.

Serial ATA II; Extensions to Serial ATA, 1.0, Revision, 1.0, Oct. 16, 2002. APT Technologies, Inc., Dell Computer Corporation, Intel Corporation, Maxtor Corporation, Seagate Technology.

Authoritative Dictionary; pp. 123-124, Dec. 1, 2000.

RAID Anatomy 101; Alan Benway; Oct. 2000; 7 pages.

Taking a Ride on the Bus; Alan Benway; Apr. 2000; 5 pages.

Serial ATA Next Generation Storage Interface; Mark Kymin; Jun. 9, 2005; pp. 1-6.

SATA PHY Interface Specification (SAPIS) Draft—Rev 0.90; Intel Corporation; Feb. 8, 2002; pp. 1-12.

SATA Technology; www.sata.or.org; Dec. 15, 2004; 8 pages.

SATA v PATA; Sanjeeb Nanda, Computer Technology Review; Nov. 2002; p. 18.

SATA (FAQs); Seagate Technology LLC; 2005; 3 pages.

Serial ATA: High Speed Serialized AT Attachment; Revision 1.0a; Jan. 7, 2003; APT Technologies, Inc., Dell Computer Corporation, Intel Corporation, Maxtor Corporation, Seagate Technology; 311 pages.

Serial ATA-to-Ultra ATA Adapter; SIIG, Inc.; 2 pages, Jun. 9, 2005.

Tempo Bridge G5 Serial ATA Interface to Parallel ATA Drive Adapter; Sonnet Technologies, Inc., Revised 2005; 3 pages.

Serial ATA in Servers and Networked Storage; 2002; 12 pages.

Serial ATA II: Port Multiplier, Revision 1.0, Mar. 25, 2003, APT Technologies, Inc., Dell Computer Corporation, Intel Corporation, Maxtor Corporation, Seagate Technology; 34 pages.

Serial ATA II Workgroup; Serial ATA II Specification Port Selector, Proposed Draft; Revision 1.0RC, Jun. 23, 2003; 21 pages.

Information Technology—AT Attachment with Packet Interface—6 (ATA/ATAPI-6), Working Draft, T13 1410D, Revision 3; Peter T. McLean; Oct. 30, 2001; 496 pages.

Serial ATA II: Port Selector, Revision 1.0, Jul. 28, 2003; Dell Computer Corporation, Intel Corporation, Maxtor Corporation, Seagate Technology, Vitesse Semiconductor Corporation; 20 pages.

* cited by examiner

CLOCK OFFSET COMPENSATOR

FIELD OF THE INVENTION

The present invention relates to clock compensation, and more particularly to compensating a local clock of a device that receives data from a host for frequency offset when transmitting data from the device to the host.

BACKGROUND OF THE INVENTION

A host and a device typically transmit and receive data to and from each other. For example in a personal computer environment, a disk drive controller (host) is often connected to a disk drive (device). The host is typically implemented using a relatively accurate host clock generator. The accuracy is often required to meet the specifications of a host processor and/or other host components.

The host and the device may be connected using a Serial Advanced Technology Attachment (SATA) standard, although other protocols may be used. The SATA standard is a simplified standard for transferring data in a packet switching network between a host and a device. SATA typically employs balanced voltage (differential) amplifiers and two pairs of wires to connect transmitters and receivers of the host and the device in a manner similar to 100BASE-TX Ethernet. The SATA standard is disclosed in "Serial ATA: High Speed Serialized AT Attachment", Serial ATA Organization, Revision 1.0, 29 Aug. 2001, and its Supplements and Errata, which are hereby incorporated by reference.

To reduce costs, the device may be implemented using a less accurate clock. For example, the device may include a resonator, which may be crystal or ceramic based. The resonator generates a reference clock for a frequency synthesizer of a phase-locked loop (PLL), which generates a higher-frequency clock. Ceramic resonators are cheaper than crystal resonators but not as accurate. The resonator can be an individual component. Alternately, the resonator can be implemented inside a clock chip (such as crystal voltage controlled oscillator (VCO)).

When the device is implemented using lower accuracy clock generators, the transmitted data from the device to the host may not meet data transmission standards, such as SATA or other standards. As a result, the device must be implemented with a more expensive local clock generator with improved accuracy, which increases the cost of the device.

SUMMARY OF THE INVENTION

A device according to the present invention communicates with a host and includes a transmitter, a receiver and a clock generator that generates a local clock frequency. A clock recovery circuit communicates with the receiver and recovers a host clock frequency from data received from the host by the receiver. A frequency offset circuit communicates with the clock recovery circuit and the clock generator and generates a frequency offset based on the clock frequency and the recovered host clock frequency. A frequency compensator compensates a frequency of the transmitter using the frequency offset.

In other features, the frequency compensator includes a low pass filter that communicates with the frequency offset circuit. The frequency compensator includes an accumulator that communicates with the low pass filter and that generates a phase offset. The frequency compensator includes an interpolator that receives a local phase from the clock generator and the phase offset from the accumulator. The interpolator outputs a compensated clock signal to the transmitter.

In yet other features, the clock generator includes a phase-locked loop circuit that includes a reference frequency generator, a phase detector that communicates with the reference frequency generator, a low pass filter that communicates with the phase detector, and a voltage controlled oscillator that communicates with the low pass filter. The reference frequency generator includes at least one of a crystal resonator and a ceramic resonator.

In still other features, a 1/N divider has an input that communicates with the voltage controlled oscillator and an output that communicates with the phase detector. A 1/M divider has an input that communicates with the reference frequency generator and an output that communicates with the phase detector. N and M are adjusted to create a spread spectrum modulation signal for spread spectrum operation. An interpolator communicates with an output of the voltage controlled oscillator and an input of the 1/N divider for smoothing.

In still other features, a summer has a first input that communicates with an output of the low pass filter and an output that communicates with an input of the accumulator. A frequency modulation generator communicates with a second input of the summer and selectively generates a spread spectrum modulation signal when spread spectrum operation is enabled and a constant signal when spread spectrum operation is disabled.

In other features, the host and the device communicate using a serial ATA standard. The host can be a disk controller and the device can be a disk drive.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein.

DETAILED DESCRIPTION OF THE PREFERRED EMBODIMENTS

Figure 1:
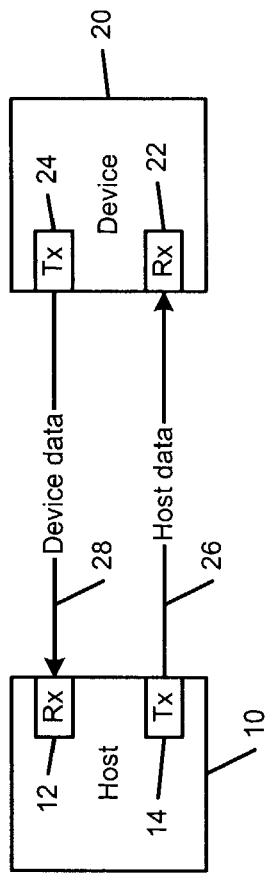
FIG. 1 is a functional block diagram illustrating a host connected to a device.

The following description of the preferred embodiment(s) is merely exemplary in nature and is in no way intended to limit the invention, its application, or uses. For purposes of clarity, the same reference numbers will be used in the drawings to identify similar elements.

Referring now to FIG. 1, a host 10 includes a receiver 12 and a transmitter 14. A device 20 includes a receiver 22 and a transmitter 24. The transmitter 14 of the host 10 transmits host data 26 to the receiver 22 of the device 20. The transmitter 24 of the device 20 transmits device data 28 to the receiver 12 of the host 10.

Figure 2:
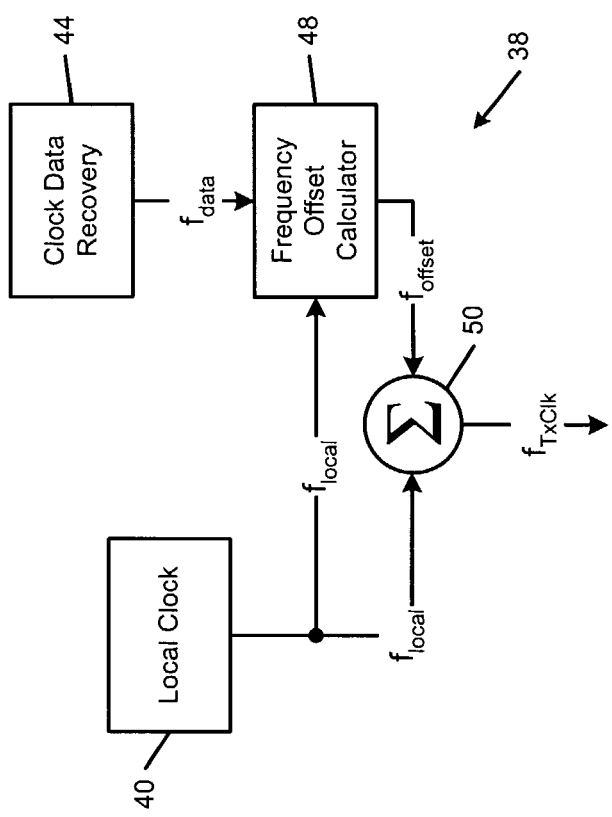
FIG. 2 is a functional block diagram illustrating a frequency offset compensator according to the present invention for a transmitter of the device of FIG. 1.

Referring now to FIG. 2, the device 20 includes a frequency offset compensator generally identified at 38. A local clock generator 40 generates a local clock frequency $f_{local}$. The device 20 also includes a clock data recovery circuit 44 that determines a clock frequency $f_{data}$ of the host 10 from data transmitted by the host 10. A frequency offset calculator 48 compares the host frequency $f_{data}$ to the local frequency $f_{local}$ and generates a frequency offset $f_{offset}$. The $f_{offset}$ is used to compensate $f_{local}$. For example, $f_{offset}$ and $f_{local}$ are summed by a summer 50. The compensated frequency is used to clock the transmitter 24 of the device 20. By compensating the frequency of the transmitter 24 of the device 20, a less expensive local clock generator can be used to reduce the cost of the device 20.

Figure 3:
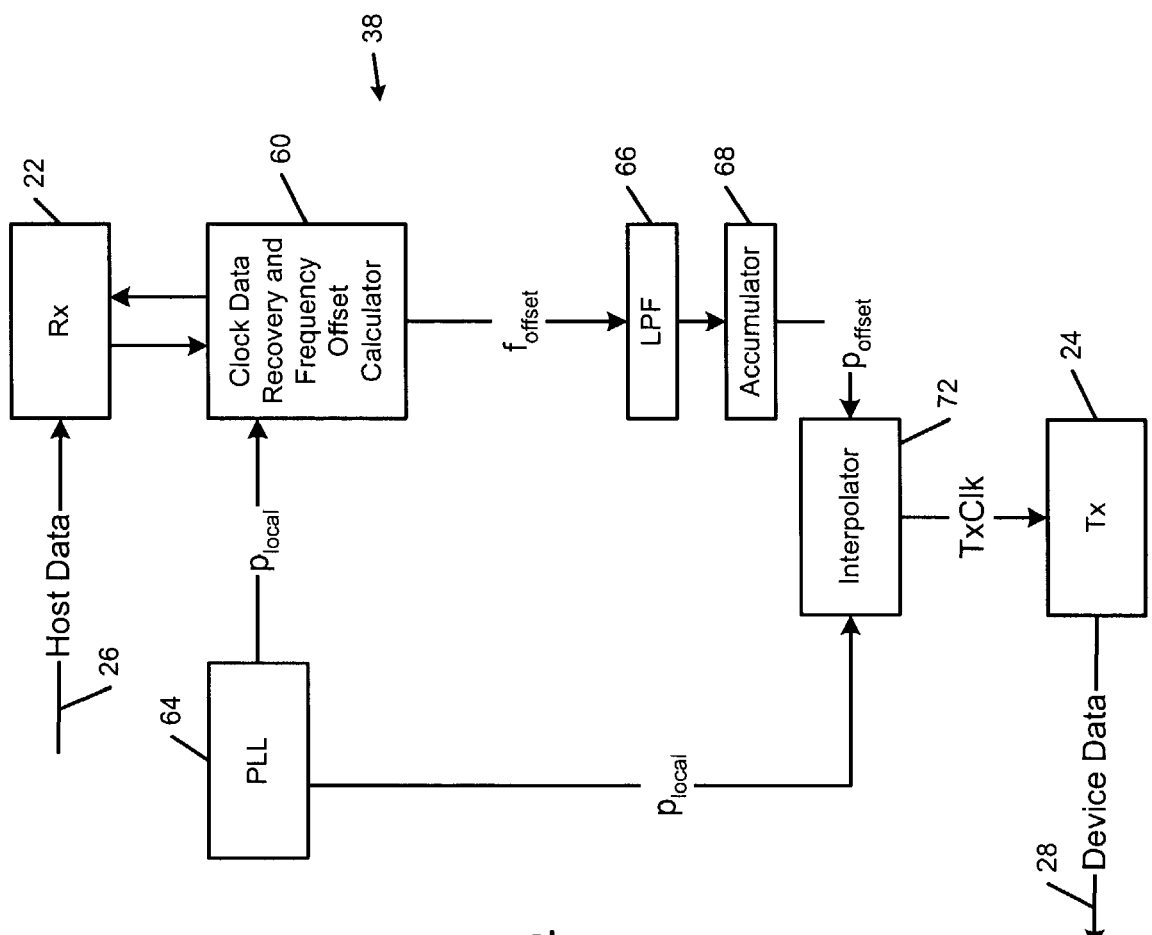
FIG. 3 is a more detailed functional block diagram of a first embodiment of the frequency offset compensator for the transmitter of the device.

Referring now to FIG. 3, the host data 26 is received by the receiver 22 of the device 20. A clock data recovery and frequency offset calculator 60 communicates with the receiver 22. A phase-locked loop (PLL) 64 generates a local phase $p_{local}$, which is output to the clock data recovery and frequency offset calculator 60. The clock data recovery and frequency offset calculator 60 outputs a receiver clock to the receiver 22 and a frequency offset $f_{offset}$ to a low pass filter (LPF) 66, which has an output that is connected to an accumulator 68.

The accumulator 68 generates a phase offset $p_{offset}$, which is input to an interpolator 72. The interpolator 72 also receives $p_{local}$ from the PLL 64. The interpolator 72 generates a compensated clock signal based on $p_{offset}$ and $p_{local}$. An output of the interpolator 72 communicates with the transmitter 24, which transmits the device data 28.

Figure 4:
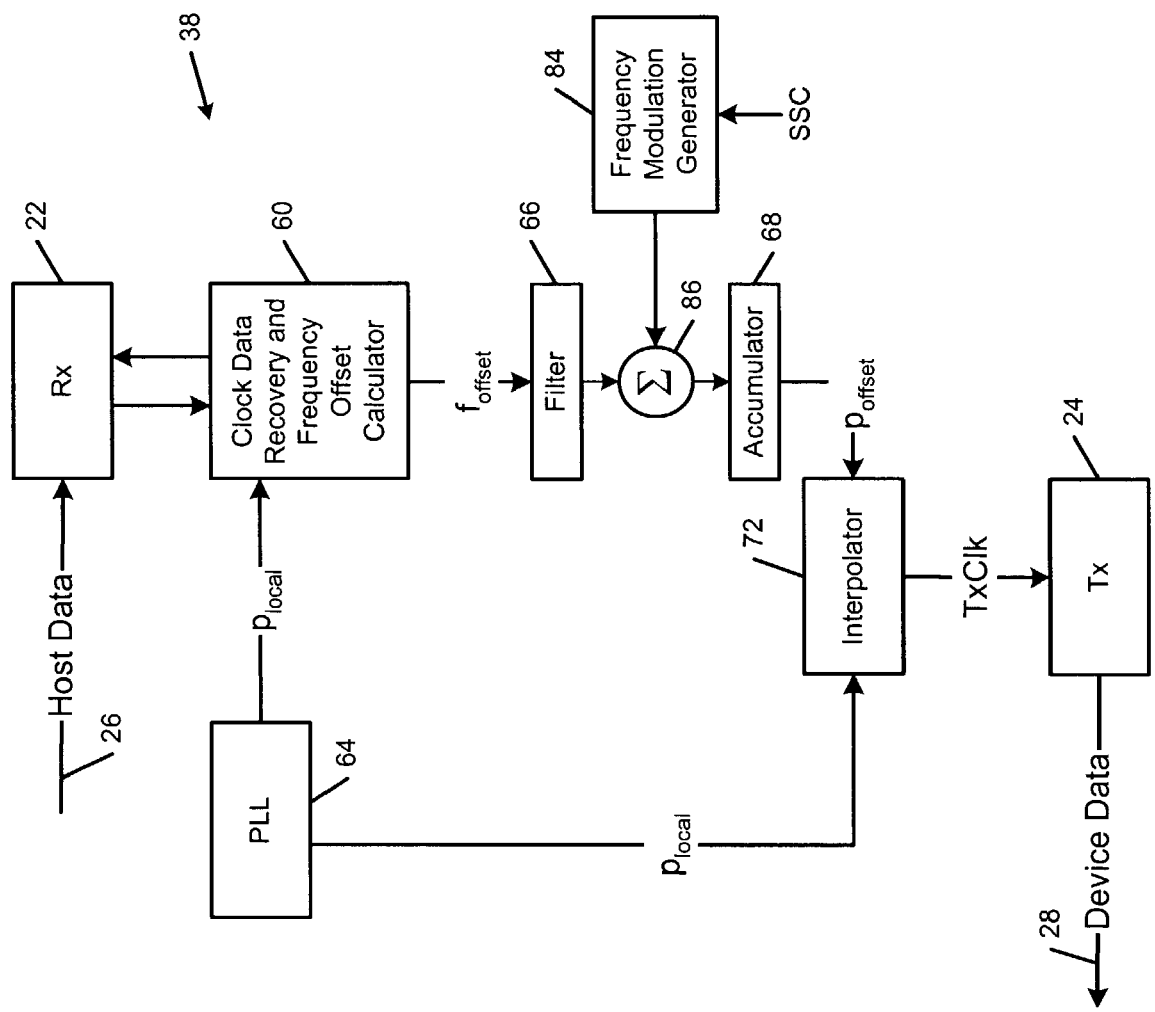
FIG. 4 is a functional block diagram of a second embodiment of a frequency offset compensator for the transmitter of the device and a triangular wave generator for optional spread spectrum operation.

Referring now to FIG. 4, an optional spread spectrum mode of operation may also be provided. A frequency modulator generator 84 selectively generates a constant output and/or a spread spectrum modulation signal based upon a spread spectrum control signal (SSC). For example, the frequency modulation generator 84 can generate a triangular wave, a sine wave or any other spread spectrum modulation signal. An output of the frequency modulation generator 84 is input to a first input of a summer 86. A second input of the summer 86 communicates with an output of the filter 66. An output of the summer 86 communicates with an input of the accumulator 68.

When the spread spectrum control (SSC) is enabled, the output of the filter 66 is summed with the spread spectrum modulation signal to generate the phase offset $p_{offset}$, which is input to the interpolator 72. When spread spectrum control is disabled, the output of the filter 66 is summed with a constant output of the frequency modulation generator 84 to generate the phase offset $p_{offset}$, which is input to the interpolator 72.

Figure 5:
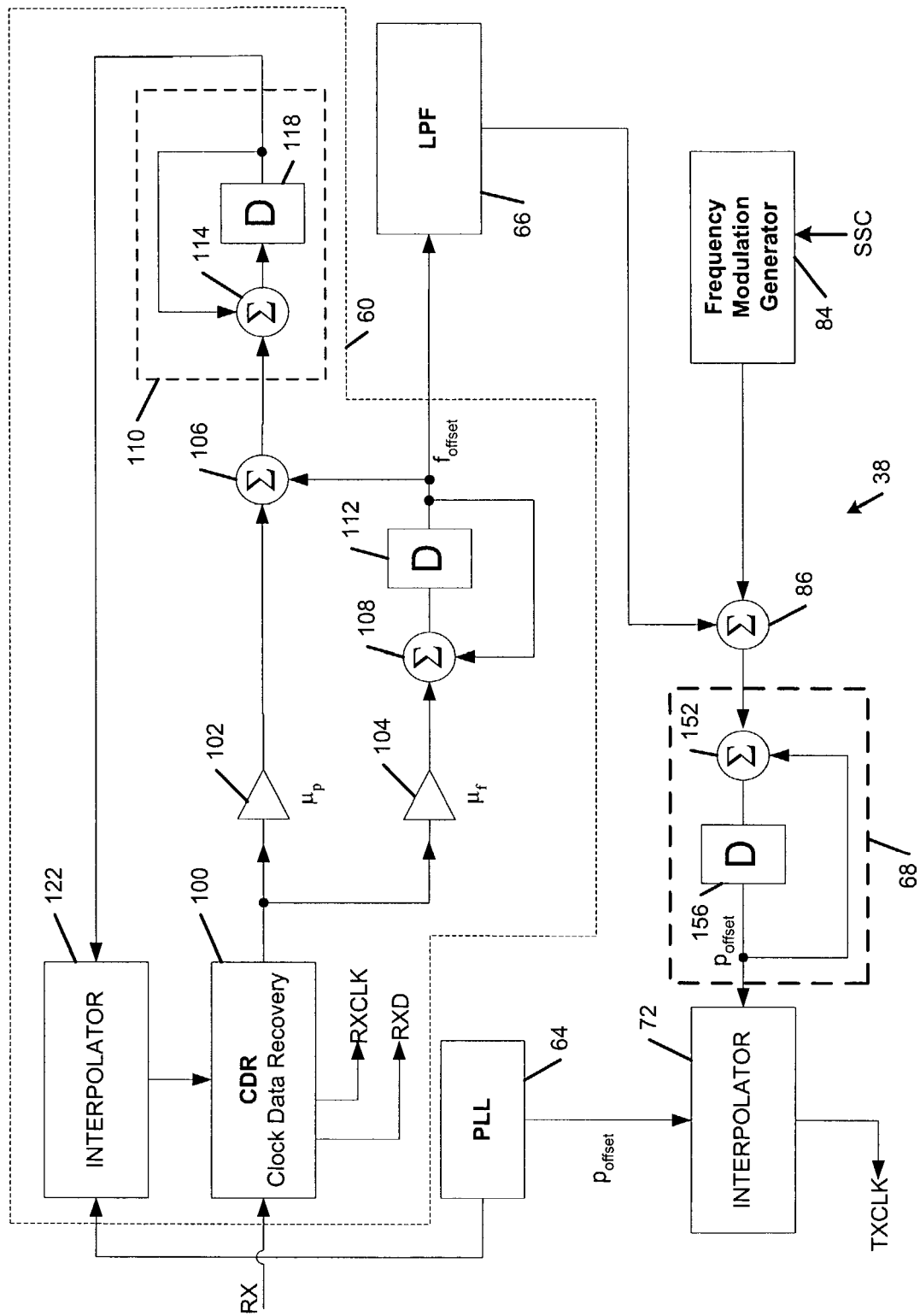
FIG. 5 is an exemplary implementation of the frequency offset compensator of FIGS. 3 and 4.

Referring now to FIG. 5, an exemplary implementation of the frequency offset compensator 38 is shown. The device 20 employs a second order timing recovery circuit. The clock data recovery and frequency offset calculator 60 includes a clock data recovery circuit 100 having an output connected to gain circuits 102 and 104. An output of the gain circuit 102 (phase error) communicates with a first input of a summer 106. An output of the gain circuit 104 (frequency error) communicates with a first input of a summer 108.

An output of the summer 108 communicates with a delay element 112, which has an output connected to a second input of the summer 106 and a second input of the summer 108. The delay elements can be registers. An output of the summer 106 is connected to an accumulator 110 including a summer 114 and a delay element 118. The output of the summer 114 is connected to a first input of the summer 114. An output of the summer 114 is connected to the delay element 118, which has an output connected to a second input of the summer 114 and to a first input of an interpolator 122.

In an exemplary implementation, the interpolator 122 operates using 128-phases at 375 MHz, although higher or lower phases and/or frequencies can be used. A second input of the interpolator 122 is connected to an output of the PLL 64. An output of the interpolator 122 is input to the clock data recovery circuit 100. The clock data recovery and frequency offset calculator 60 outputs the frequency offset $f_{offset}$, which is input to the LPF 66. An output of the LPF 66 is connected to the summer 86.

An output of the frequency modulation generator 84 is connected to a second input of the summer 86. An output of the summer 86 is connected to a first input of a summer 152 in the accumulator 68. An output of the summer 152 is connected to a delay element 156, which has an output that is connected to the interpolator 72 and to a second input of the summer 152. The interpolator 72 operates using 128-phases at 750 MHz, although higher or lower phases and/or frequencies can be used.

Figure 6:
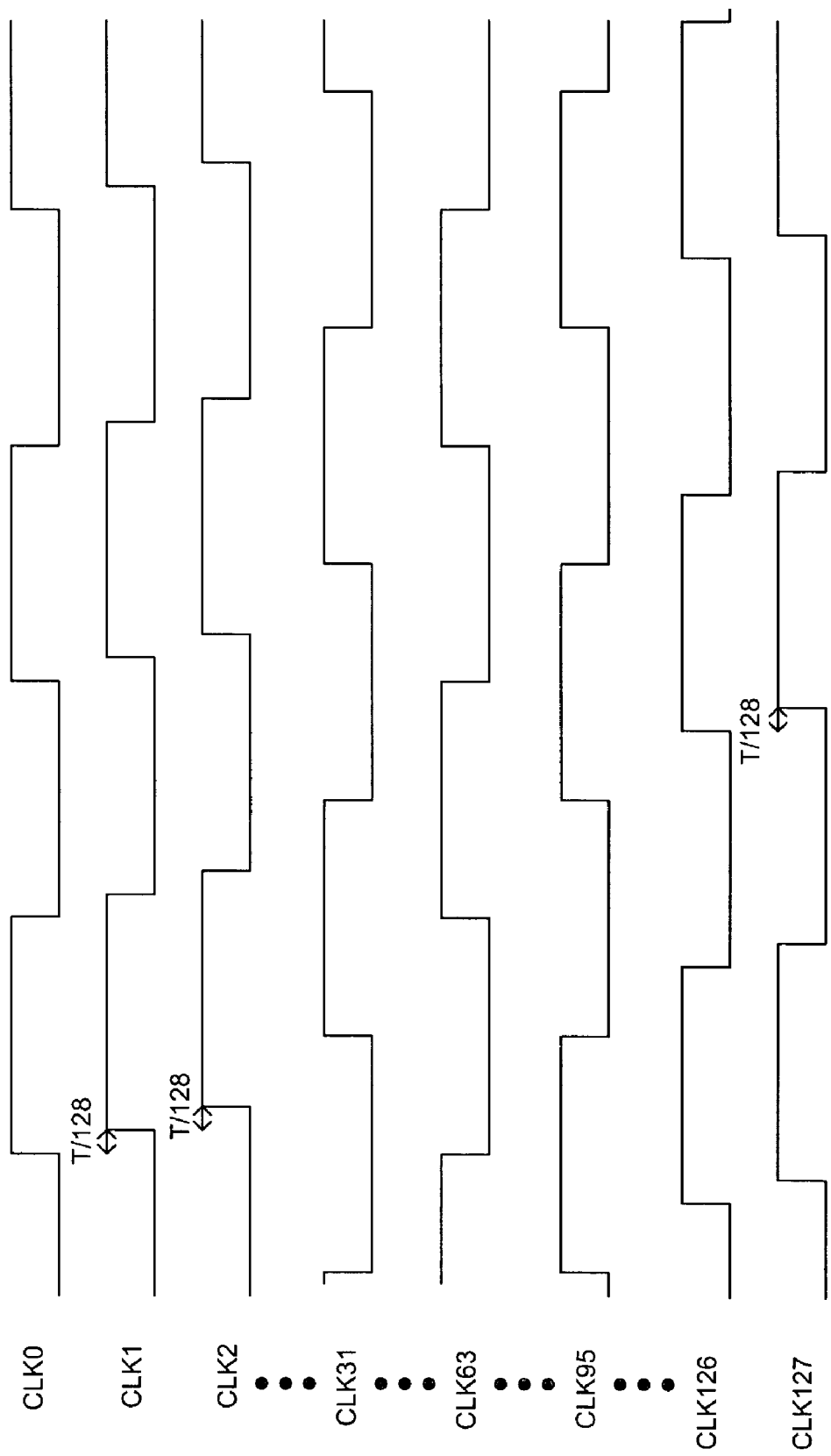
FIG. 6 illustrates clock timing for an exemplary interpolator shown in FIGS. 3-5.

Referring now to FIG. 6, operation of the interpolators is illustrated briefly. The interpolators divide a clock frequency into multiple phases. For example, the interpolator 72 divides a clock frequency into 128 phases. Interpolation and frequency adjustment is performed by jumping the phase forward or backward. For example, CLK0 is T/128 before CLK1. CLK3 is 2T/128 after CLK0. CLK0 is 5T/128 before CLK6.

Figure 7:
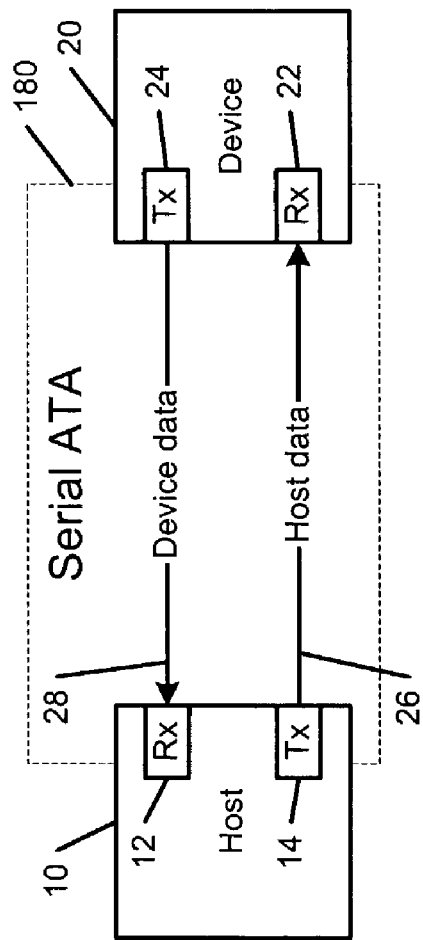
FIG. 7 illustrates the host and the device of FIG. 1 with a connection based on the SATA standard.
Figure 8:
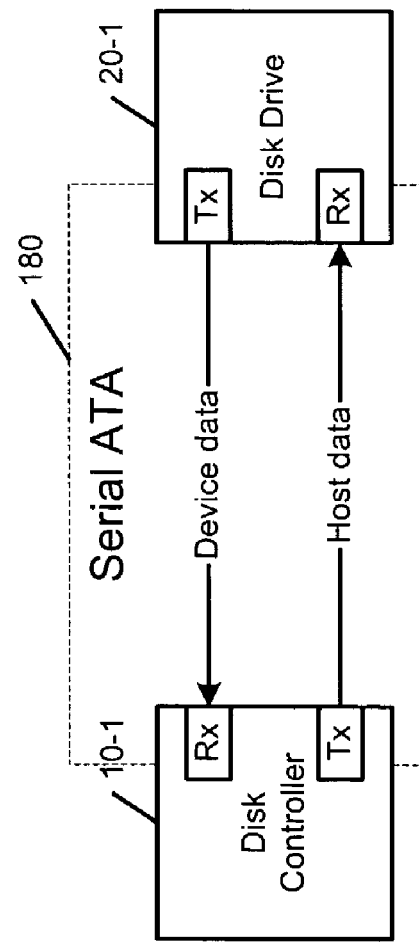
FIG. 8 illustrates a disk controller and a disk drive with a connection based on the SATA standard.

Referring now to FIG. 7, the host 10 and the device 20 may be connected by a serial ATA medium 180. Referring now to FIG. 8, the host 10 can be a disk controller 10-1 and the device 20 can be a disk drive 20-1. Still other hosts, devices and connection standards can be employed.

Figure 9:
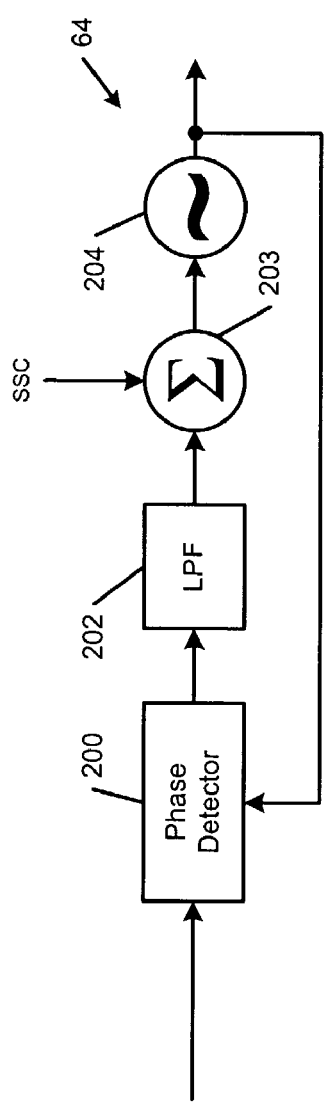
FIGS. 9 and 10 illustrate phase-locked loop (PLL) circuits according to the prior art.
Figure 10:
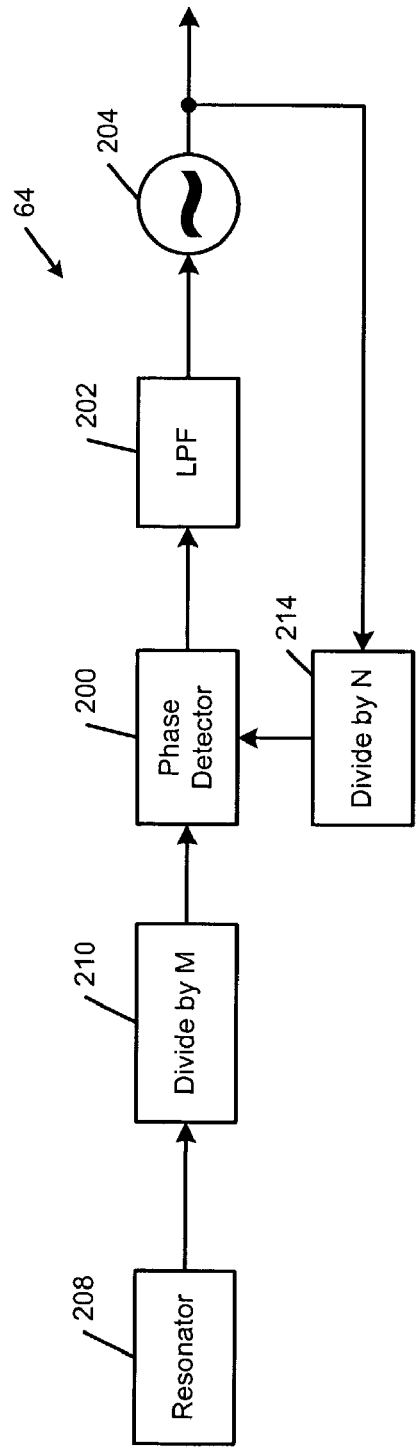
Figure 11:
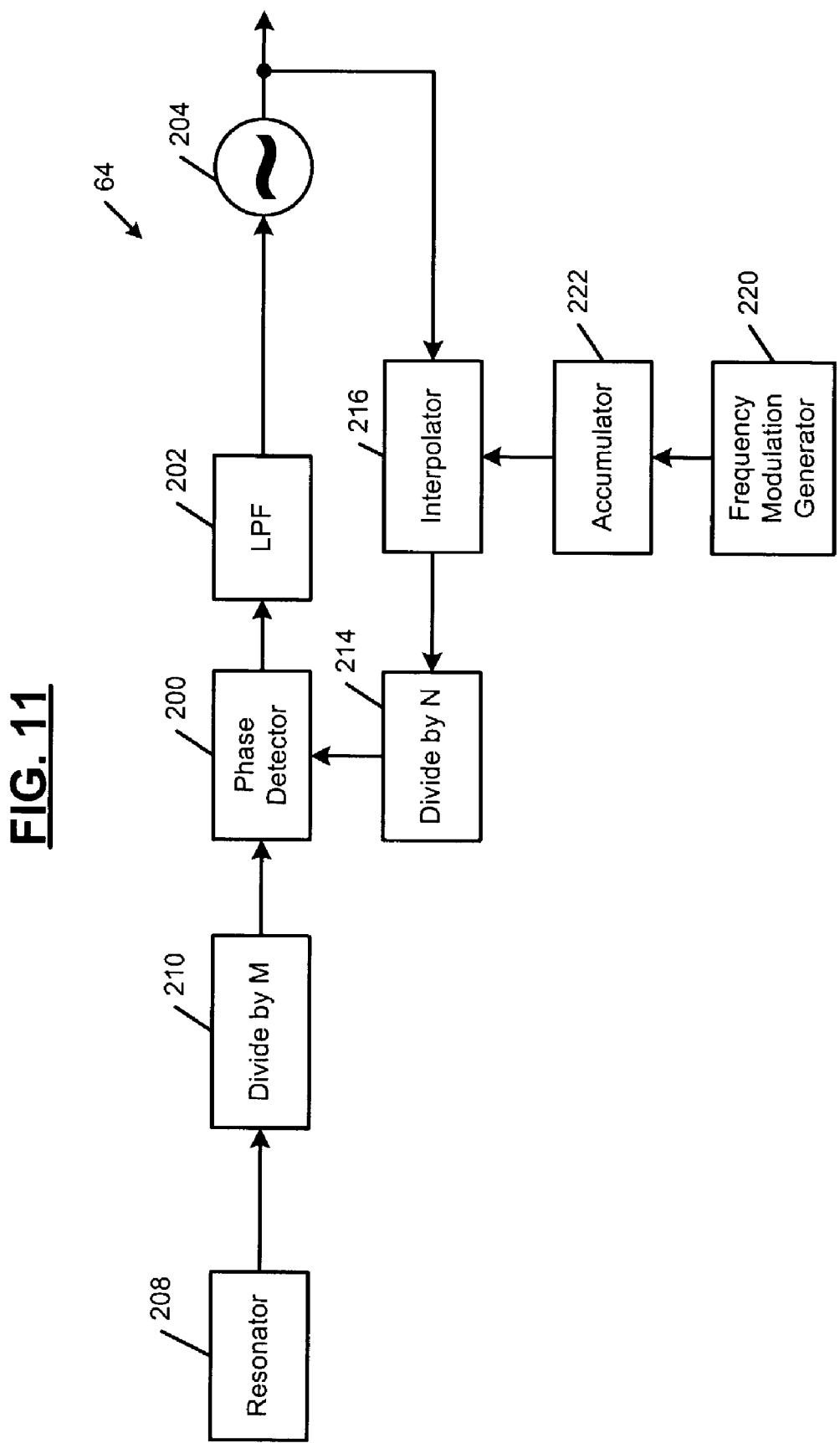
FIG. 11 illustrates a closed loop PLL for spread spectrum operation according to the present invention.

Referring now to FIGS. 9-11, several exemplary implementations of the PLL 64 are shown. In FIG. 9, the PLL 64 includes a phase detector 200 having an input connected to a reference frequency. An output of the phase detector 200 is input to a low pass filter 202, which has an output that is connected to a first input of a summer 203. A spread spectrum control (SSC) signal is input to a second input of the summer 203. An output of the summer is input to a voltage controlled oscillator (VCO) 204, which has an output that is fed back to the phase detector 200. In FIG. 10, the PLL 64 supports open-loop spread spectrum operation. The reference frequency is input to a divide by M circuit 210. The output of the VCO 204 is fed back through a divide by N circuit 214. M and N are modulated to generate a triangular wave.

In FIG. 11, the PLL 64 supports closed loop spread spectrum operation. The reference frequency is input to the divide by M circuit 210. The output of the VCO 204 is fed back to a first input of an interpolator 216. A frequency modulation generator 220 outputs a spread spectrum modulation signal, such as a triangular wave, sine wave, etc., to an accumulator 220. An output of the accumulator 220 is input to a second input of the interpolator 216. M and N are modulated to generate a triangular wave. The interpolator 216 provides smoothing. The reference frequency for the PLL 64 may be generated by a resonator, although other reference frequency generators can be used.

Those skilled in the art can now appreciate from the foregoing description that the broad teachings of the present invention can be implemented in a variety of forms. Therefore, while this invention has been described in connection with particular examples thereof, the true scope of the invention should not be so limited since other modifications will become apparent to the skilled practitioner upon a study of the drawings, the specification and the following claims.

What is claimed is:

1. A device that communicates with a host, comprising:
   a transmitter;
   a receiver;
   a clock generator that generates a signal having a local clock frequency;
   a clock recovery circuit that communicates with said receiver and that recovers a host clock frequency from data received from said host by said receiver;
   a frequency offset circuit that communicates with said clock recovery circuit and said clock generator and that generates a frequency offset based on said clock frequency and said recovered host clock frequency;
   a frequency compensator that compensates a frequency of said transmitter using said frequency offset,
   wherein said frequency compensator includes a low pass filter that communicates with said frequency offset circuit, said frequency compensator includes an accumulator that communicates with said low pass filter and that generates a phase offset, said frequency compensator includes an interpolator that receives a local phase from said clock generator and said phase offset from said accumulator, and said interpolator outputs a compensated clock signal to said transmitter;
   a summer having a first input that communicates with an output of said lowpass filter and an output that communicates with an input of said accumulator; and
   a frequency modulation generator that communicates with a second input of said summer and that selectively generates a spread spectrum modulation signal when spread spectrum operation is enabled and a constant signal when spread spectrum operation is disabled.

2. The device of claim 1 wherein said clock generator includes a phase-locked loop circuit that includes:
   a reference frequency generator;
   a phase detector that communicates with said reference frequency generator;
   a low pass filter that communicates with said phase detector; and
   a voltage controlled oscillator that communicates with said low pass filter.

3. The device of claim 2 wherein said reference frequency generator includes at least one of a crystal resonator and a ceramic resonator.

4. The device of claim 2 further comprising a 1/N divider having an input that communicates with said voltage controlled oscillator and an output that communicates with said phase detector, and a 1/M divider having an input that communicates with said reference frequency generator and an output that communicates with said phase detector, wherein N and M are adjusted to create a spread spectrum modulation signal for spread spectrum operation.

5. The device of claim 4 further comprising a second interpolator that communicates with an output of said voltage controlled oscillator and an input of said 1/N divider.

6. The device of claim 1 wherein said host and said device communicate using a serial advanced technology attachment (SATA) standard.

7. The device of claim 1 wherein said host is a disk controller and said device is a disk drive.

8. A communication system including:
   a host including a host transmitter, a host receiver, and a host clock generator that generates a signal having a host clock frequency;
   a device that communicates with said host using a serial ATA standard and that includes a device transmitter, a device receiver, a device clock generator that generates a local clock frequency, a clock recovery circuit that recovers said host clock frequency from data received from said host by said device receiver, a frequency offset circuit that generates a frequency offset based on said local clock frequency and said recovered host clock frequency, and a frequency compensator that compensates a frequency of said device transmitter using said frequency offset,
   wherein said frequency compensator includes a low pass filter that communicates with said frequency offset circuit, said frequency compensator includes an accumulator that communicates with said low pass filter and that generates a phase offset, and said frequency compensator includes an interpolator that receives a local phase from said device clock generator and said phase offset from said accumulator;
   a summer having a first input that communicates with an output of said low pass filter and an output that communicates with an input of said accumulator; and
   a frequency modulation generator that communicates with a second input of said summer and that selectively generates a spread spectrum modulation signal when spread spectrum operation is enabled and a constant signal when spread spectrum operation is disabled.

9. The communication system of claim 8 wherein said device clock generator includes a phase-locked loop circuit that includes:
   a reference frequency generator;
   a phase detector that communicates with said reference frequency generator;
   a low pass filter that communicates with said phase detector; and
   a voltage controlled oscillator that communicates with said low pass filter.

10. The communication system of claim 9 wherein said reference frequency generator includes at least one of a crystal resonator and a ceramic resonator.

11. The communication system of claim 9 further comprising a 1/N divider having an input that communicates with said voltage controlled oscillator and an output that communicates with said phase detector, and a 1/M divider having an input that communicates with said reference frequency generator and an output that communicates with said phase detector, wherein N and M are adjusted to create a spread spectrum modulation signal for spread spectrum operation.

12. The communication system of claim 11 further comprising a second interpolator that communicates with an output of said voltage controlled oscillator and an input of said 1/N divider.

13. The communication system of claim 8 wherein said host is a disk controller and said device is a disk drive.

14. A frequency offset compensator for a device that communicates with a host, comprising:
a clock data recovery and frequency offset calculator that generates a frequency offset;
a frequency modulation generator that generates a spread spectrum modulation signal when spread spectrum operation is enabled; and
a summer that adds said frequency offset and an output of said frequency modulation generator to generate a summed frequency offset;
a conversion circuit that converts said summed frequency offset to a phase offset.

15. The frequency offset compensator of claim 14 wherein said frequency modulation generator outputs a constant when spread spectrum operation is disabled and wherein said summer adds said frequency offset and said constant when said spread spectrum operation is disabled.

16. The frequency offset compensator of claim 14 further comprising: a device transmitter;
a device clock that generates a local phase; and
an interpolator that has a first input that receives said local phase, a second input that receives an output of said summer, and an output that communicates with a transmitter of said device.

17. A device that communicates with a host, comprising:
transmitting means for transmitting data to said host;
receiving means for receiving data from said host;
clock generating means for generating a signal having a local clock frequency;
clock recovery means for recovering a host clock frequency from data received from said host by said receiving means;
frequency offset means for generating a frequency offset based on said clock frequency and said recovered host clock frequency;
frequency compensating means for compensating a frequency of said transmitting means using said frequency offset,
wherein said frequency compensating means includes filtering means for filtering an output of said frequency offset means, said frequency compensating means further includes accumulating means that communicates with said filtering means for generating a phase offset, and said frequency compensating means further includes interpolating means that receives a local phase from said clock generating means and said phase offset from said accumulating means for generating a compensated clock signal for said transmitting means;
frequency modulation generating means for selectively generating a spread spectrum modulation signal when spread spectrum operation is enabled and a constant signal when spread spectrum operation is disabled; and
summing means for summing an output of said filtering means and said frequency modulation generating means and having an output that communicates with an input of said accumulating means.

18. The device of claim 17 wherein said clock generating means includes a phase-locked loop circuit that includes:
generating means for generating a reference frequency;
detecting means for detecting a phase of said reference frequency; filtering means for filtering said phase output by said detecting means; and
a voltage controlled oscillator that communicates with said filtering means.

19. The device of claim 18 wherein said generating means includes at least one of a crystal resonator and a ceramic resonator.

20. The device of claim 18 further comprising:
first dividing means having an input that communicates with said voltage controlled oscillator and an output that communicates with said detecting means for dividing an output of said voltage controlled oscillator by N; and
second dividing means having an input that communicates with said generating means and an output that communicates with said detecting means for dividing said reference frequency by M, wherein N and M are adjusted to create a spread spectrum modulation signal for spread spectrum operation.

21. The device of claim 20 further comprising:
frequency modulation generating means for generating a spread spectrum modulation signal;
accumulating means that communicates with an output of said frequency modulation generating means for generating a phase from said spread spectrum modulation signal; and
second interpolating means for communicating with an output of said voltage controlled oscillator and said accumulating means and an input of said first dividing means.

22. The device of claim 17 wherein said host and said device communicate using a serial ATA standard.

23. The device of claim 17 wherein said host is a disk controller and said device is a disk drive.

24. A communication system including:
a host including host transmitting means for transmitting data, host receiving means for receiving data, and host clock generating means for generating a signal having a host clock frequency;
a device that communicates with said host using a serial ATA standard and that includes device transmitting means for transmitting data, device receiving means for receiving data, device clock generating means for generating a local clock frequency, clock recovery means for recovering said host clock frequency from data received from said host by said device receiving means, frequency offset means for generating a frequency offset based on said local clock frequency and said recovered host clock frequency, and frequency compensating means for compensating a frequency of said device transmitting means based on said frequency offset,
wherein said frequency compensating means includes filtering means for filtering said frequency offset, said frequency compensating means further includes accumulating means that communicates with said filtering means for generating a phase offset, and said frequency compensating means includes interpolating means for receiving a local phase from said device clock generating means and said phase offset from said accumulating means;
frequency modulation generating means for selectively generating a spread spectrum modulation signal when spread spectrum operation is enabled and a constant when spread spectrum operation is disabled; and summing means for summing an output of said filtering means and said frequency modulation generating means and having an output that communicates with an input of said accumulating means.

25. The communication system of claim 24 wherein said device clock generator includes a phase-locked loop circuit that includes:
generating means for generating a reference frequency;
detecting means for detecting a phase of said reference frequency; filtering means for filtering said phase; and
a voltage controlled oscillator that communicates with said filtering means.

26. The communication system of claim 25 wherein said generating means includes at least one of a crystal resonator and a ceramic resonator.

27. The communication system of claim 25 further comprising:
first dividing means having an input that communicates with said voltage controlled oscillator and an output that communicates with said detecting means for dividing an output of said voltage controlled oscillator by N; and
second dividing means having an input that communicates with said generating means and an output that communicates with said detecting means for dividing said reference frequency by M, wherein N and M are adjusted to create a spread spectrum modulation signal for spread spectrum operation.

28. The communication system of claim 27 further comprising interpolating means for communicating with an output of said voltage controlled oscillator and an input of said first dividing means.

29. The communication system of claim 24 wherein said host is a disk controller and said device is a disk drive.

30. A frequency offset compensator for a device that communicates with a host, comprising:
offset calculating means for generating a frequency offset;
frequency modulation generating means for generating a spread spectrum modulation signal when spread spectrum operation is enabled; summing means for generating a summed frequency offset by summing said frequency offset and said spread spectrum modulation signal; and conversion means for converting said summed frequency offset to a phase offset.

31. The frequency offset compensator of claim 30 wherein said frequency modulation generating means outputs a constant when spread spectrum operation is disabled and wherein said summing means adds said frequency offset and said constant when said spread spectrum operation is disabled.

32. The frequency offset compensator of claim 30 further comprising: device transmitting means for transmitting data;
device clocking means for generating a local phase; and
interpolating means for receiving said local phase and said phase offset and for compensating a clock of said device transmitting means.

33. A method for providing frequency offset compensation for a device that communicates with a host, comprising:
generating a frequency offset;
generating a spread spectrum modulation signal when spread spectrum operation is enabled;
summing said frequency offset and said spread spectrum modulation signal to generate a summed frequency offset; and
converting said summed frequency offset to a phase offset.

34. The method of claim 33 further comprising:
generating a constant signal when spread spectrum operation is disabled; and
summing said frequency offset and said constant when said spread spectrum operation is disabled to generate said summed frequency offset.

35. The method of claim 33 further comprising:
transmitting data from said device;
generating a local phase; and
compensating a transmitter clock based on said local phase and said phase offset.

* * * * *